United States Patent [19]
Choi

[11] Patent Number: 5,714,402
[45] Date of Patent: Feb. 3, 1998

[54] METHOD FOR FABRICATING A CAPACITOR OF A SEMICONDUCTOR DEVICE AND THE STRUCTURE OF THE SAME

[75] Inventor: Kyeong Keun Choi, Ichon, Rep. of Korea

[73] Assignee: Hyundai Electronics Industries Co., Ltd., Rep. of Korea

[21] Appl. No.: 757,246

[22] Filed: Nov. 27, 1996

[30] Foreign Application Priority Data

Nov. 30, 1995 [KR] Rep. of Korea .................. 95-45483

[51] Int. Cl.$^6$ .................................................. H01L 21/70
[52] U.S. Cl. .......................... 437/60; 437/52; 437/201; 437/919
[58] Field of Search ........................ 437/52, 60, 919, 437/201

[56] References Cited

U.S. PATENT DOCUMENTS

| | | | |
|---|---|---|---|
| 5,262,920 | 11/1993 | Sakuma et al. | 361/321.5 |
| 5,335,138 | 8/1994 | Sandhu et al. | 437/60 |
| 5,407,855 | 4/1995 | Maniar et al. | 437/60 |
| 5,475,248 | 12/1995 | Takenaka | 257/295 |
| 5,489,548 | 2/1996 | Nishioka et al. | 437/60 |
| 5,506,166 | 4/1996 | Sandhu et al. | 437/60 |
| 5,534,458 | 7/1996 | Okudaira et al. | 437/52 |
| 5,554,564 | 9/1996 | Nishioka et al. | 437/60 |
| 5,555,486 | 9/1996 | Kingon et al. | 437/60 |
| 5,566,045 | 10/1996 | Summerfelt et al. | 437/60 |
| 5,568,352 | 10/1996 | Hwang | 437/919 |
| 5,573,979 | 11/1996 | Tsu et al. | 437/201 |
| 5,604,145 | 2/1997 | Hashizume et al. | 437/52 |
| 5,618,746 | 4/1997 | Hwang | 437/201 |
| 5,622,893 | 4/1997 | Summerfelt et al. | 437/201 |
| 5,637,527 | 6/1997 | Baek | 437/60 |

*Primary Examiner*—Charles L. Bowers, Jr.
*Assistant Examiner*—Toniae M. Thomas
*Attorney, Agent, or Firm*—Gary M. Nath; Nath & Associates

[57] ABSTRACT

A capacitor structure suitable for the high integration of a semiconductor device is fabricated with a method comprising the steps of: providing a semiconductor substrate; forming a ruthenium-platinum film on the semiconductor substrate; thermally treating the ruthenium-platinum film to grow a ruthenium-platinum oxide on the ruthenium-platinum film; and forming a dielectric film and a conductive layer on the ruthenium-platinum oxide, in sequence.

16 Claims, 4 Drawing Sheets

METHOD FOR FABRICATING A CAPACITOR OF A SEMICONDUCTOR DEVICE AND THE STRUCTURE OF THE SAME

BACKGROUND OF THE INVENTION

1. Field of the invention

The present invention relates, in general, to a capacitor of a semiconductor device and, more particularly, to a capacitor suitable for the high integration of a semiconductor device. Also, the present invention is concerned with a method for fabricating the capacitor structure.

2. Description of the Prior Art

As semiconductor devices are highly integrated, the cell generally becomes smaller in size, which makes it more difficult to secure enough storage capacitance proportional to the surface area of a storage electrode. In particular, in the case of a DRAM device, whose unit cell consists of one MOS transistor and one capacitor, the pivotal point of high integration is to increase the storage capacitance of the capacitor, which occupies a great area in chip, while reducing the area occupied by the capacitor.

Various techniques have been suggested in order to raise the storage capacitance of capacitor, represented by the following equation:

$$C = \frac{E_o \times E_r \times A}{T}$$

wherein C stands for the storage capacitance of the capacitor, $E_o$ for a vacuum dielectric constant, $E_r$ for a dielectric constant of dielectric film, A for an area of the capacitor and T for the thickness of the capacitor.

For example, a dielectric film with a high dielectric constant was formed from a thin BST ($(Ba,Sr)TiO_3$) or PZT ($Pb(Zr_yTi_x)O_3$) film, each having a high dielectric constant $E_r$, allowing a semiconductor device to be highly integrated. However, this technique has a disadvantage in that hillocks and pin holes are generated on the surface of the lower electrode constituting the capacitor, making electrical properties of the device unstable and deteriorating the reproductivity.

To overcome this disadvantage, there is another technique in which a capacitor is composed of a lower electrode and an upper electrode, both formed of ruthenium oxide ($RuO_2$) or platinum (Pt), and stabilized through thermal treatment.

When employing ruthenium oxide for the electrodes, stress occurs between the dielectric film and the upper electrode upon thermal treatment. Further, the characteristics of the dielectric film are deteriorated because oxygen or silicon is diffused from the upper and/or lower electrode into the dielectric film. Another disadvantage is that the ruthenium oxide film is formed slowly.

In the case in which the upper and the lower electrodes are formed of platinum, silicon and silicide are formed on the surface of the platinum at 200°–300° C. upon thermal treatment, giving rise to a remarkable increase in leakage current. Thus, not only do the electrical properties of the electrodes become poor, but the adhesiveness to insulating film also becomes worse. In addition, the platinum is likely to generate hillocks due to stress, and the characteristics of the thin film are lowered as time passes.

Taking the advantages of the ruthenium oxide and platinum, a technique of forming an electrode was proposed to solve the above-mentioned problems as disclosed in Integrated Ferroelectrics, 1995, Vol. 8, pp 151–163 to H. N. Al-Shareef. However, the above conventional technique is also disadvantageous in that the preparation process of capacitor is very complicated so that the reliability of a semiconductor device is reduced. Moreover, the complicated process causes an increase in production cost, lowering productivity.

Therefore, the above conventional fabrication techniques of a capacitor of a semiconductor device, are not suitable for the high integration of semiconductor device.

SUMMARY OF THE INVENTION

Therefore, it is an object of the present invention to overcome the above problems encountered in prior arts and to provide a capacitor structure of a semiconductor device, having a capacitance which is high enough for the high integration of semiconductor device.

It is another object of the present invention to provide a method for fabricating the capacitor structure.

In accordance with an aspect of the present invention, a method for fabricating a capacitor of a semiconductor device comprises the steps of: providing a semiconductor substrate; forming a ruthenium-platinum film on the semiconductor substrate; thermally treating the ruthenium-platinum film to grow a ruthenium-platinum oxide on the ruthenium-platinum film; and forming a dielectric film and a conductive layer on the ruthenium-platinum oxide, in sequence.

In accordance with another aspect of the present invention, a method for fabricating a capacitor of a semiconductor device comprises the steps of: providing a semiconductor substrate; forming a lower insulating layer over said semiconductor substrate, said lower insulating layer having a contact hole through which a predetermined area of said semiconductor substrate is exposed; forming a contact plug in said contact hole of said lower insulating layer; forming a titanium film and a titanium nitride film over said contact plug and said lower insulating layer, in sequence; forming a ruthenium-platinum film on said titanium nitride film; thermally treating said platinum-ruthenium film to grow a ruthenium-platinum oxide on said ruthenium-platinum film; patterning said ruthenium-platinum oxide, said ruthenium-platinum film, said titanium nitride and titanium film; and forming a dielectric film and a plate electrode over the resulting structure, in sequence.

In accordance with yet another aspect of the present invention, a capacitor of a semiconductor device comprises a lower electrode on a semiconductor substrate, a dielectric film and an upper electrode, wherein said lower electrode comprises a ruthenium-platinum film and a ruthenium-platinum oxide.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

Figure 1:
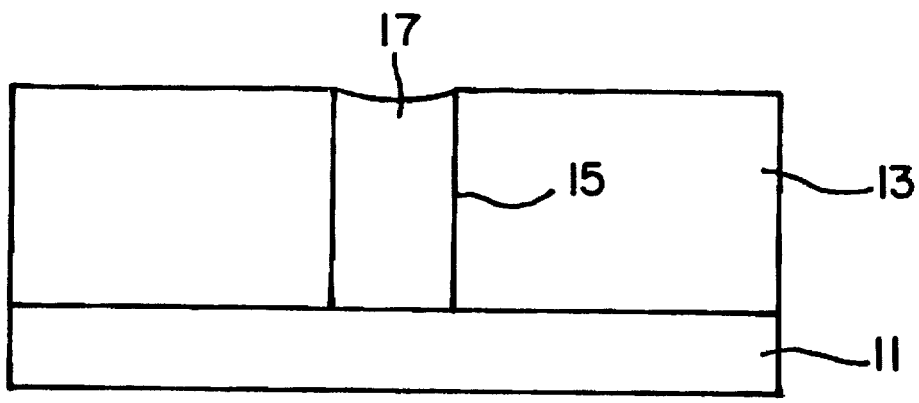
FIGS. 1 through 7 are schematic cross sectional views showing a method for fabricating a capacitor of a semiconductor device, according to the present invention.

The application of the preferred embodiment of the present invention is best understood with reference to the accompanying drawings, wherein like reference numerals are used for like and corresponding parts, respectively.

As shown in FIG. 1, a lower insulating layer 13 is first formed on a semiconductor substrate 11, with the aim of planarizing the overall structure consisting of an element insolation film (not shown), a gate oxide film (not shown) and a gate electrode (not shown). After formation of the gate electrode, a bit line may be formed. The lower insulating layer 13 is made of an insulating material superior in flowability, such as borophosphosilicate glass (hereinafter referred to as "BPSG").

Then, using a contact mask (not shown), an etch process is carried out by which the lower insulating layer 13 is selectively opened to form a contact hole 15 through which a predetermined area of the semiconductor substrate 11, that is, an impurity-implanted area is exposed.

Subsequently, over the resulting structure, including the lower insulating layer 13 and the contact hole 15, a blanket of a polysilicon is deposited, and then subjected to etch back to form a contact plug polysilicon film 17 in the contact hole 15.

Figure 2:
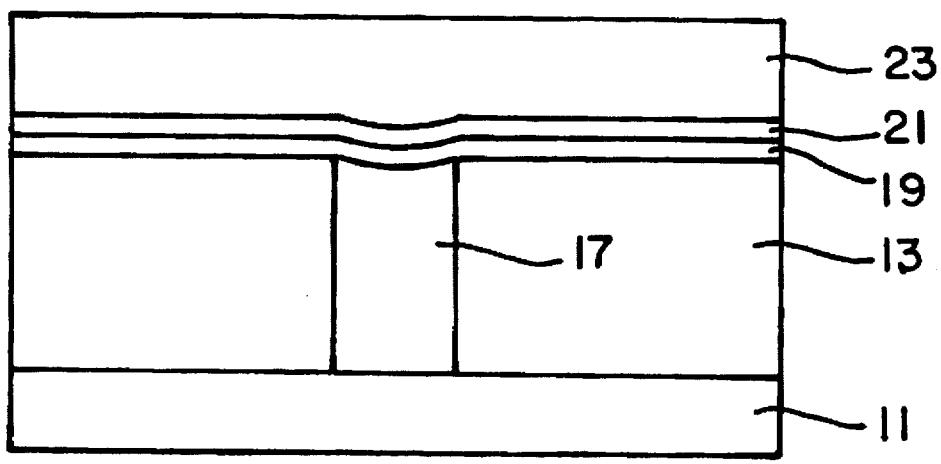

FIG. 2 is a cross section taken after a titanium film 19 and a titanium nitride film 21 are, in sequence, formed over the resulting structure, followed by the deposition of a ruthenium-platinum film 23 over the titanium nitride film 21. The titanium film 19 is about 100–300 Angstrom thick with the titanium nitride film 21 having a thickness of about 200–400 Angstrom. For the ruthenium-platinum film 23, a thickness ranging from about 2,000 to 5,000 Angstrom is provided. A sputtering process is performed for the deposition of ruthenium-platinum film 23, in which ruthenium and platinum are used as targets, simultaneously. This deposition process for the ruthenium-platinum film 23 takes advantage of a sputter employing a DC or RF magnetic source. The deposition process is preferably carried out at a substrate temperature ranging from room temperature to 700° C. at a power of 50–5,000 watts under a pressure of 1 mTorr–100 Torr for 1–10 min. As an atmosphere, a nitrogen, argon or oxygen gas is used.

Figure 3:
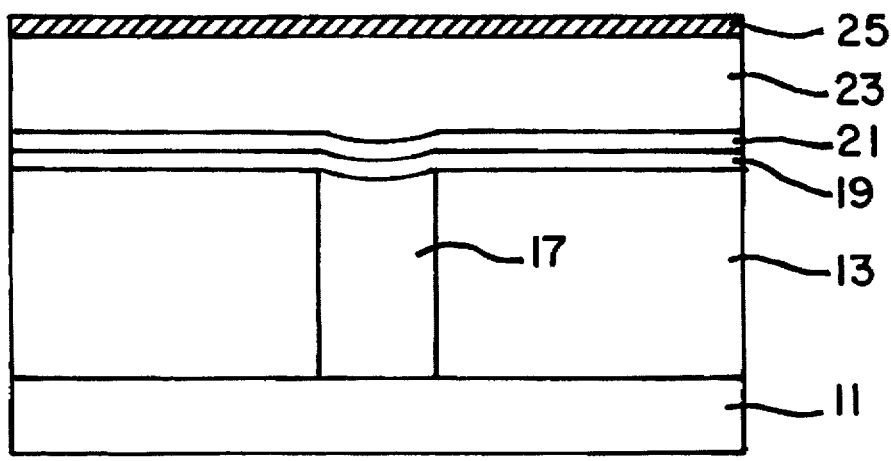

Next, a thermal process is performed under an oxygen atmosphere for about 0.5–2 hrs to grow an oxide 25 on the surface of the ruthenium-platinum film 23, as shown in FIG. 3. This ruthenium-platinum oxide 25 is represented by $Ru_xO_yPt_z$ (x, y and z each stand for composition ratios with x+y+z=1). This thermal process is carried out at a temperature of about 500°–850° C.

Figure 4:
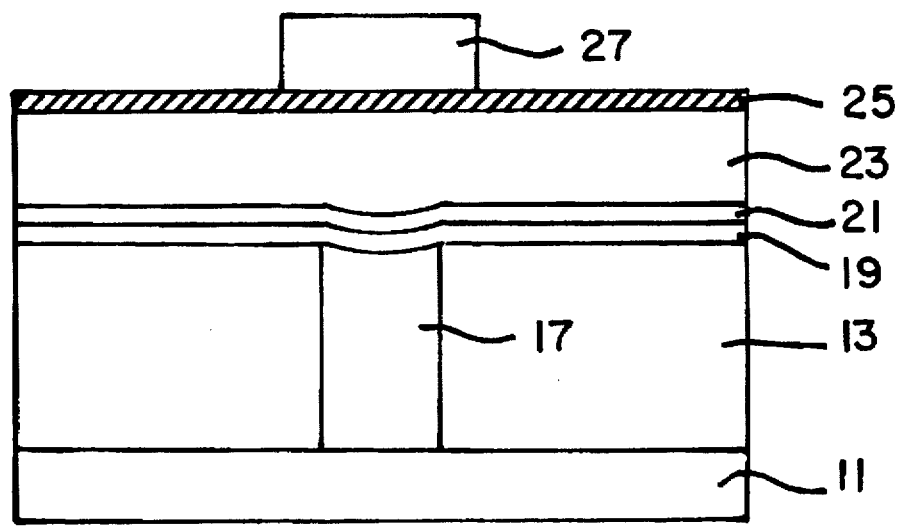

FIG. 4 is a cross section taken after a photosensitive film pattern 27 is formed over the resulting structure. For this, a photosensitive film (not shown) is formed over the resulting structure and etched using a storage electrode mask (not shown).

Figure 5:
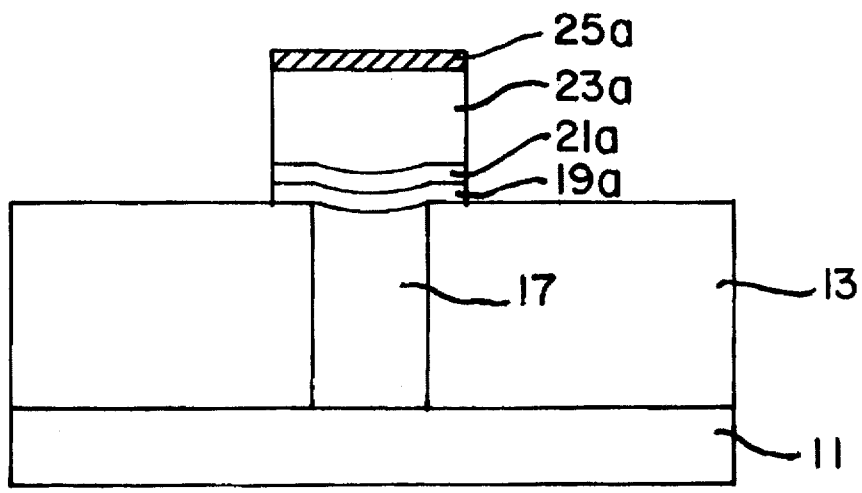

FIG. 5 is a cross section taken after using the photosensitive film pattern 27 as a mask, the ruthenium-platinum oxide 25, ruthenium-platinum film 23, the titanium nitride film 21 and the titanium film 19 are, in sequence, etched to form a ruthenium-platinum oxide pattern 25a, a ruthenium-platinum pattern 23a, a titanium nitride pattern 21a and a titanium film pattern 19a, respectively, followed by the removal of the photosensitive film pattern 27.

Figure 6:
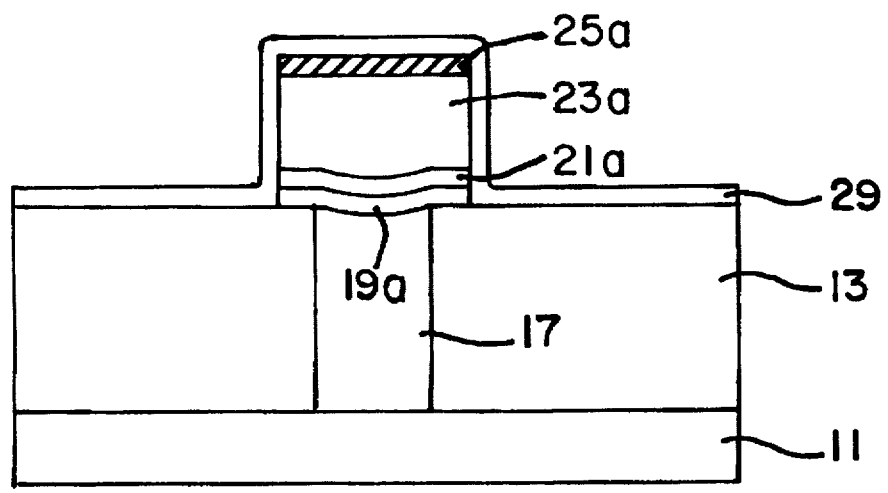

Thereafter, a dielectric film 29 with a high dielectric constant is formed at a certain thickness over the resulting structure, as shown in FIG. 6. As the dielectric film (29), an insulating film with a high dielectric constant, such as BST or PZT, is used. A thickness of about 300–600 Angstrom is preferred for the dielectric film 29.

Figure 7:
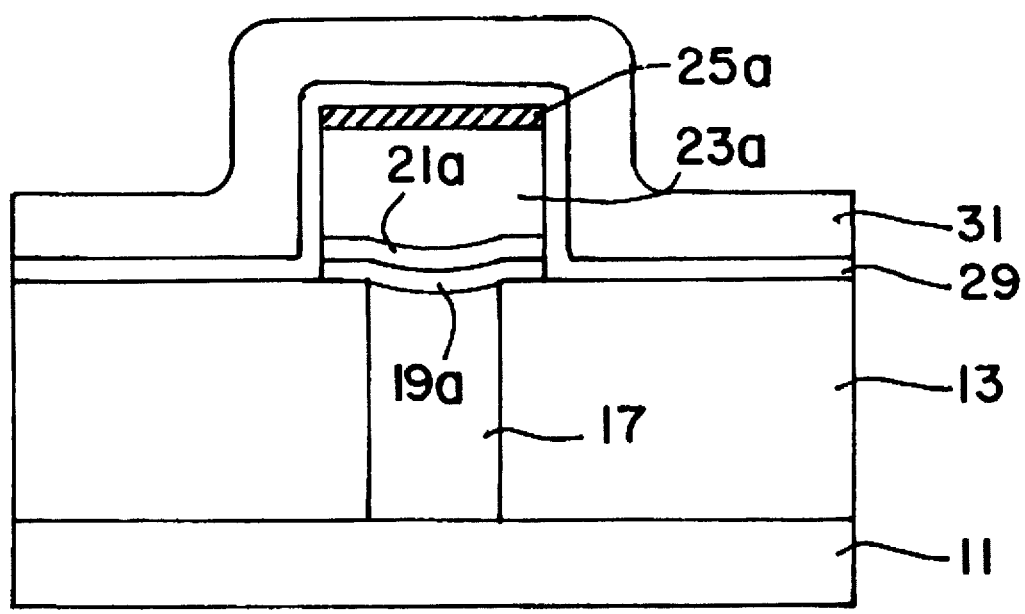

Finally, as shown in FIG. 7, a conductive layer is deposited over the dielectric film 29 to form a plate electrode 31, thereby creating a capacitor having a capacitance high enough for the high integration of a semiconductor device.

As described hereinbefores, because ruthenium and platinum does not form a complicated combined structure but are taken as a simultaneous target for deposition, the procedure can be simplified. Furthermore, because the composition of ruthenium and platinum can be controlled with ease in accordance with the present invention, it can be adjusted into the properties of the dielectric film. In addition, the ruthenium-platinum target enables oxygen atmosphere to be used to form the lower electrode of ruthenium-platinum oxide, that is, the storage electrode.

Consequently, a remarkable improvement can be brought into the electrical properties and reliability of a semiconductor device, and ultimately provides a basis of the high integration of a semiconductor device, in accordance with the present invention.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced ways other than those specifically described.

What is claimed is:

1. A method for fabricating a capacitor of a semiconductor device, comprising the steps of:
   providing a semiconductor substrate:
   forming a simultaneously deposited ruthenium-platinum film on the semiconductor substrate;
   thermally treating the ruthenium-platinum film to grow a ruthenium-platinum oxide on the ruthenium-platinum film; and
   forming a dielectric film and a conductive layer on the ruthenium-platinum oxide, in sequence.

2. A method in accordance with claim 1, further comprising the step of forming a titanium film and a titanium nitride film between the semiconductor substrate and the ruthenium-platinum film.

3. A method in accordance with claim 1, wherein said ruthenium-platinum film is formed in a sputtering process in which ruthenium and platinum are simultaneously taken as a target.

4. A method in accordance with claim 3, wherein said ruthenium-platinum film is formed at room temperature to 700° C. and at a power of 50–5,000 watts under a deposition pressure of about 1 mTorr to 100 Torr for 1–10 min in a DC sputtering process.

5. A method in accordance with claim 3, wherein said ruthenium-platinum film is formed at room temperature to 700° C. and at a power of 50–5,000 watts under a deposition pressure of about 1 mTorr to 100 Torr for 1–10 min in an RF sputtering process.

6. A method in accordance with claim 1, wherein said thermal treatment step is carried out at about 500°–850° C. for about 0.5–2 hrs.

7. A method for fabricating a capacitor of a semiconductor device, comprising the steps of:
   providing a semiconductor substrate;
   forming a lower insulating layer over said semiconductor substrate, said lower insulating layer having a contact hole through which predetermined area of said semiconductor substrate is exposed;
   forming a contact plug in said contact hole of said lower insulating layer;
   forming a titanium film and a titanium nitride film over said contact plug and said lower insulating layer, in sequence;

forming a simultaneously deposited ruthenium-platinum film on said titanium nitride film;

thermally treating said platinum-ruthenium film to grow a ruthenium-platinum oxide on said ruthenium-platinum film;

patterning said ruthenium-platinum oxide, said ruthenium-platinum film, said titanium nitride and titanium film; and forming a dielectric film and a plate electrode over the resulting structure, formed in said pattering step, in sequence.

8. A method in accordance with claim 7, wherein said lower insulating film is formed of an insulating material superior in flowability.

9. A method in accordance with claim 7, wherein said contact plug is formed of polysilicon.

10. A method in accordance with claim 7, wherein said titanium film is formed at a thickness of about 100–300 Angstrom.

11. A method in accordance with claim 7, wherein said titanium nitride film is formed at a thickness of about 200–400 Angstrom.

12. A method in accordance with claim 7, wherein said ruthenium-platinum film is formed in a sputtering process in which ruthenium and platinum are simultaneously taken as a target.

13. A method in accordance with claim 12, wherein said ruthenium-platinum film is formed at room temperature to 700° C. and at a power of 50–5,000 watts under a deposition pressure of about 1 mTorr to 100 Torr for 1–10 min in a DC sputtering process.

14. A method in accordance with claim 12, wherein said ruthenium-platinum film is formed at room temperature to 700° C. and at a power of 50–5,000 watts under a deposition pressure of about 1 mTorr to 100 Torr for 1–10 min in an RF sputtering process.

15. A method in accordance with claim 7, wherein said thermal treatment step is carried out at about 500°–850° C. for about 0.5–2 hrs.

16. A method in accordance with claim 7., wherein said dielectric film is formed at a thickness of 300–600 Angstrom.

* * * * *

UNITED STATES PATENT AND TRADEMARK OFFICE
CERTIFICATE OF CORRECTION

PATENT NO. : 5,714,402
DATED : Feb. 3, 1998
INVENTOR(S) : Kyeong Keun CHOI

It is certified that error appears in the above-identified patent and that said Letters Patent is hereby corrected as shown below:

In claim 7, line 6, please delete "predetermined" and insert --a--.

In claim 16, line 1, please delete "." after "7".

Signed and Sealed this

Ninth Day of June, 1998

Attest:

BRUCE LEHMAN

Attesting Officer

Commissioner of Patents and Trademarks